US012199094B2

(12) United States Patent
Yang et al.

(10) Patent No.: US 12,199,094 B2
(45) Date of Patent: Jan. 14, 2025

(54) APPARATUSES INCLUDING FinFETs HAVING DIFFERENT GATE OXIDE CONFIGURATIONS, AND RELATED COMPUTING SYSTEMS

(71) Applicant: Micron Technology, Inc., Boise, ID (US)

(72) Inventors: Hyuck Soo Yang, Boise, ID (US); Byung Yoon Kim, Boise, ID (US); Yong Mo Yang, Boise, ID (US); Shivani Srivastava, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 435 days.

(21) Appl. No.: 17/453,727

(22) Filed: Nov. 5, 2021

(65) Prior Publication Data

US 2023/0141716 A1 May 11, 2023

(51) Int. Cl.
 *H01L 27/088* (2006.01)
 *H01L 21/28* (2006.01)
 (Continued)

(52) U.S. Cl.
 CPC .... *H01L 27/0886* (2013.01); *H01L 21/28194* (2013.01); *H01L 21/823431* (2013.01);
 (Continued)

(58) Field of Classification Search
 CPC ..... H01L 21/823462; H01L 21/823431; H01L 27/0886; H01L 29/785; H01L 29/42364
 See application file for complete search history.

(56) References Cited

U.S. PATENT DOCUMENTS 5,502,009 A * 3/1996 Lin ................. H01L 21/823462
  438/981
2004/0087159 A1 5/2004 Kim et al.
(Continued)

FOREIGN PATENT DOCUMENTS

CN    113380890 A   9/2021
KR  10-2004-0059729 A   7/2004

OTHER PUBLICATIONS

International Search Report for Application No. PCT/US2022/079138 dated Mar. 9, 2023, 4 pages.
(Continued)

*Primary Examiner* — Tuan A Hoang
(74) *Attorney, Agent, or Firm* — TraskBritt

(57) ABSTRACT

Fin field effect transistors (FinFETs) having various different thicknesses of gate oxides and related apparatuses, methods, and computing systems are disclosed. An apparatus includes first FinFETs, second FinFETs, and third FinFETs. The first FinFETs include a first gate oxide material, a second gate oxide material, and a third gate oxide material. The second FinFETs include the second gate oxide material and the third gate oxide material. The third FinFETs include the third gate oxide material. A method includes forming the first gate oxide material on first fins, second fins, and third fins; removing the first gate oxide material from the second fins and the third fins; forming a second gate oxide material over the first fins, the second fins, and the third fins; and removing the second gate oxide material from the third fins.

13 Claims, 11 Drawing Sheets

(51) Int. Cl.
*H01L 21/8234* (2006.01)
*H01L 29/423* (2006.01)
*H10B 12/00* (2023.01)

(52) U.S. Cl.
CPC ............... *H01L 21/823462* (2013.01); *H01L 29/42364* (2013.01); *H10B 12/50* (2023.02)

(56) References Cited

U.S. PATENT DOCUMENTS

| | | |
|---|---|---|
| 2011/0057252 A1 | 3/2011 | Park |
| 2015/0069524 A1* | 3/2015 | Hong ................ H01L 21/82385 438/587 |
| 2016/0111426 A1* | 4/2016 | Tsai ................ H01L 21/823431 257/369 |
| 2017/0278755 A1 | 9/2017 | Chuang et al. |
| 2018/0122930 A1* | 5/2018 | Okamoto ............ H01L 27/0886 |

OTHER PUBLICATIONS

International Written Opinion for Application No. PCT/US2022/079138 dated Mar. 9, 2023, 4 pages.

* cited by examiner

APPARATUSES INCLUDING FinFETs HAVING DIFFERENT GATE OXIDE CONFIGURATIONS, AND RELATED COMPUTING SYSTEMS

TECHNICAL FIELD

This disclosure relates generally to fin field effect transistors (FinFETs) having variable thicknesses of gate oxides and/or variable fin heights.

BACKGROUND

The demand for ever smaller and/or denser devices in semiconductor devices drove semiconductor device manufacturers to reduce gate lengths in planar transistors to the point where leakage currents were difficult to prevent. Voltage potentials applied to gate terminals of these planar transistors did not sufficiently prevent leakage currents in active material that was relatively far from material of the gate terminal because gate terminals in these planar transistors were typically positioned at only one side of the active materials. By contrast, FinFETs include gate material at two or more sides of the active material. Accordingly, voltage potentials applied to gate terminals of FinFETs may influence substantially the entire active material. As a result, FinFETs, as compared to planar transistors, generally have reduced leakage currents because the active material is at least partially surrounded by the gate material.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
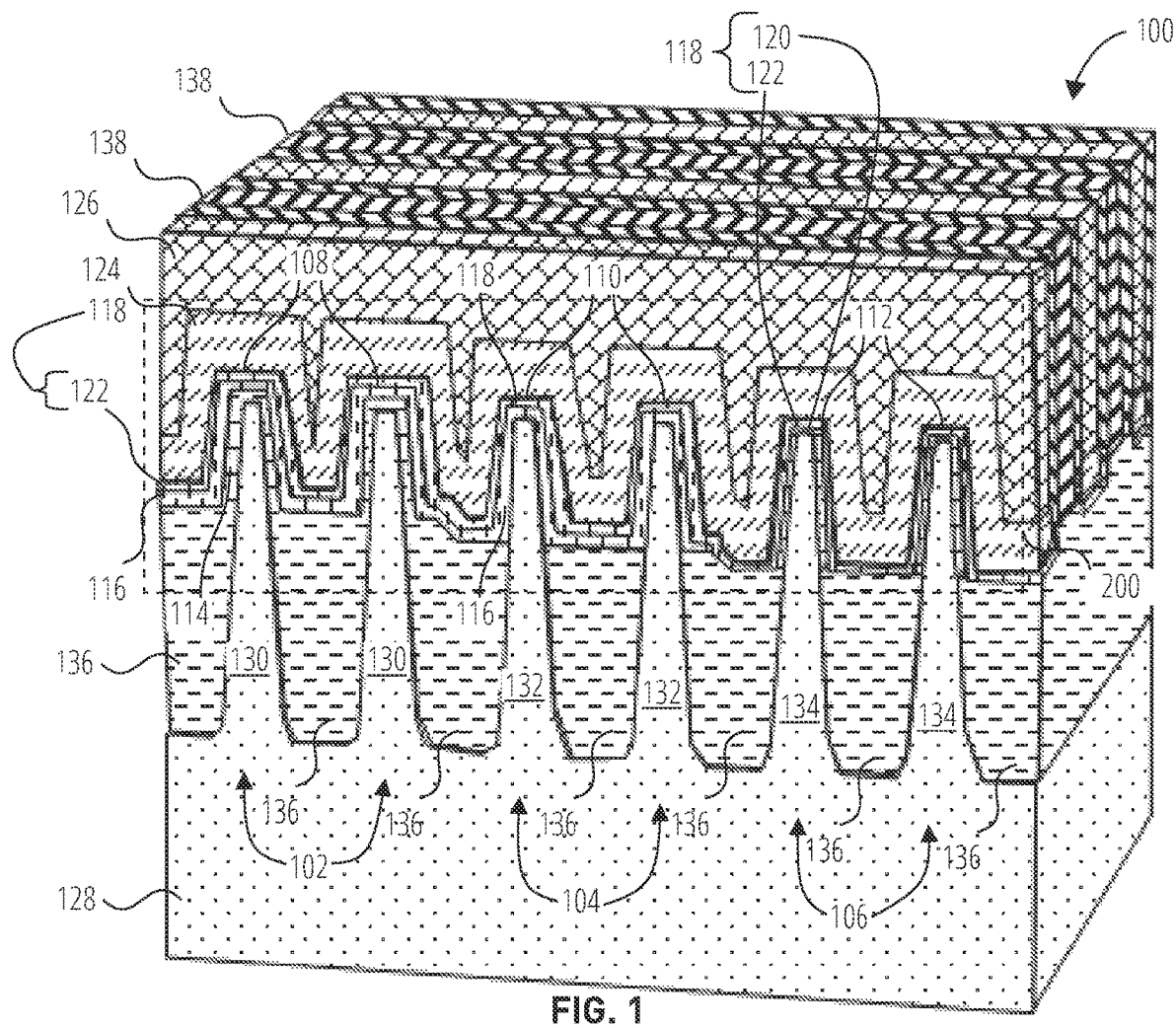
FIG. 1 is a perspective view of a portion of an apparatus, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the singular forms "a," "an," and "the" are intended to include the plural forms as well, unless the context clearly indicates otherwise.

As used herein, "and/or" includes any and all combinations of one or more of the associated listed items.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "high permittivity dielectric material," or equivalently "high-k dielectric material," refers to a material having a higher relative permittivity than silicon dioxide ($SiO_2$). The relative permittivity of silicon dioxide is substantially 3.9 at room temperature (i.e., substantially 20 degrees centigrade). Hafnium oxide ($HfO_2$) is one example of a high-k dielectric material because the relative permittivity of Hafnium oxide is greater than that of silicon dioxide (e.g., up to substantially 25). Other examples of high-k dielectric materials include zirconium dioxide ($ZrO_2$, relative permittivity of substantially 25), zirconium silicate ($ZrSiO_4$, relative permittivity of substantially 5 to 12), and hafnium silicate ($HfSiO_4$, relative permittivity of substantially 11).

As used herein, the term "semiconductor material" refers to a material having a conductivity between those of electrically insulating materials and electrically conductive materials. For example, a semiconductor material may have a conductivity of between about $10^{-8}$ Siemens per centimeter (S/cm) and about $10^4$ S/cm ($10^6$ S/m) at room temperature. Examples of semiconductor materials include elements found in column IV of the period table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the period table of elements (III-V semiconductor materials) or from columns II and VI of the period table of elements (II-VI semiconductor materials), without limitation. Semiconductor devices often include crystalline semiconductor materials. By way of non-limiting examples, transistors and diodes include crystalline semiconductor materials.

As used herein, the term "intrinsic semiconductor material" refers to a semiconductor material having a relatively small density of impurities (e.g., a lower density of impurities than electron and hole densities resulting from thermal generation at room temperature).

As used herein, the term "doped semiconductor material" refers to a semiconductor material having a higher density of impurities introduced thereto than intrinsic semiconductor materials (e.g., a higher density of impurities than electron and hole densities resulting from thermal generation at room temperature). A doped semiconductor material may be doped predominantly with donor impurities such as phosphorus (P), antimony (Sb), bismuth (Bi), and arsenic (As), without limitation. Each donor impurity in a crystal lattice of semiconductor material adds a free electron, which increases the conductivity of the semiconductor material relative to the intrinsic form of the semiconductor material. Doped semiconductor materials that have been doped predominantly with donor impurities are referred to herein as "N-type semiconductor materials." A doped semiconductor may instead be doped predominantly with trivalent or acceptor impurities such as boron (B), indium (In), aluminum (Al), and gallium (Ga), without limitation. Each trivalent or acceptor impurity in a crystal lattice of semiconductor material adds an electron hole (referred to herein as "hole"), which increases the conductivity of the semiconductor material relative to the intrinsic form of the semiconductor material. Doped semiconductor materials that have been doped predominantly with trivalent or acceptor impurities are referred to herein as "P-type semiconductor materials."

As used herein, the term "active material" refers to a semiconductor material that has been doped to function as a channel material in a metal oxide semiconductor (MOS) field effect transistor (FET) (MOSFET). A MOSFET transistor having a channel material that has been doped predominantly with donor impurities is referred to herein as an N-type MOS (NMOS) transistor because the active material serving as the channel material for the NMOS transistor includes N-type semiconductor material. Similarly, a MOSFET transistor having a channel material that has been doped predominantly with trivalent or acceptor impurities is referred to herein as a P-type MOS (PMOS) transistor because the active material serving as the channel material for the PMOS transistor includes P-type semiconductor material.

FinFETs are examples of MOSFET transistors that include fin-shaped active materials, or "fins," and gate materials on at least two sides of the fins. Some FinFET transistors include gate materials on three sides of the fins, such as on lateral and top sides of the fins. Gate oxide materials electrically isolate the fins from the gate materials.

In some semiconductor devices (e.g., memory devices, without limitation) some FinFETs may be exposed to higher voltage potentials than other FinFETs. In other words, higher voltage potential differences may be applied across terminals of some FinFET s than others. As a specific, non-limiting example, some CMOS periphery circuitry for dynamic random access memory (DRAM) devices may include FinFETs that may be exposed to relatively high voltage potentials and other FinFETs that may be exposed to relatively low voltage potentials. In general, FinFETs with thicker gate oxide materials have higher transistor breakdown voltage potential ratings than FinFETs with thinner gate oxide materials. As a result, FinFETs that may have higher voltage potentials applied across their terminals may be manufactured with thicker gate oxide materials than FinFETs that may have lower voltage potentials applied across their terminals to prevent transistor breakdown.

Manufacturing thicker gate oxide materials, however, may result in fins becoming too thin (e.g., less than four nanometers) as silicon consumption to form thicker gate oxides may consume a relatively large amount of the active material of the fins. By way of non-limiting example, radical oxides (e.g., in-situ steam generated (ISSG) oxides) may consume nearly 45% of the active material of the fin during manufacturing. Structural instability of the fins and/or performance degradation (e.g., degraded carrier mobility) due to quantum confinement and/or stress on the fin material may result if the fins are too thin (e.g., less than four nanometers thin).

Designers of electronic circuitry including FinFETs that may be used for high-voltage operation (e.g., periphery circuitry for memory devices such as periphery circuitry for dynamic random access memory (DRAM)) may be faced with a choice between using thin gate oxide FinFETs, which may break down during high voltage operation, and thick gate oxide FinFETs, which may suffer from performance degradation related to fin consumption. Since the thin gate oxide FinFETs may break down during high voltage operation, such FinFETs may not be used for electronic circuitry that may be used for high-voltage operation. As a result, high-voltage circuitry such as DRAM periphery circuitry may be implemented using thick gate oxide FinFETs, which may result in degraded performance of the high-voltage circuitry.

Disclosed herein are FinFETs including gate oxides of various different thicknesses. Rather than limiting designers to choose between two different gate oxide thicknesses, embodiments disclosed herein enable manufacturing of intermediate gate oxide thicknesses between thick gate oxides and thin gate oxides. The availability of multiple different gate oxide thicknesses may provide designers flexibility, and enable designers to tailor transistors for efficient design and performance enhancement while reducing overall area.

Various embodiments disclosed herein relate to methods of manufacturing FinFETs including gate oxides of various different thicknesses. Rather than relying solely on the use of radical oxidation to form intermediate and thick gate oxides, which may result in degrading levels of fin consumption, various methods of manufacturing FinFETs disclosed herein may employ deposition processes such as atomic layer deposition (ALD) to form at least a portion of the oxide material of the thick and/or intermediate-thickness gate oxides. As a result, designers of electronic devices such as DRAM periphery circuitry may use FinFETs including gate oxides having intermediate-thickness that is more resilient to break down than thin gate oxide FinFETs, but that do not manifest performance degradation associated with thick gate oxide FinFETs. Even where thick gate oxide FinFETs are used, the use of at least some deposited oxide in such thick gate oxide FinFETs may result in less performance degradation than FinFETs that include gate oxides formed solely using radical oxidation, which consumes the material of the fins.

In some embodiments thicker gate oxide materials may be accompanied by lower fin heights than higher fin heights that may be accompanied by thinner gate oxide materials due to removal of a portion of shallow trench isolation (STI) oxide material from between fins during removal of excess gate oxide material of thinner gate oxide material FinFETs. As used herein, the term "fin height" refers to a height of active material of a fin in a FinFET that is overlapped with a gate material. Lower fin heights may result in poorer transistor performance than that of higher fin heights (e.g., because the effective gate width is less for lower fin heights than for higher fin heights). By contrast, the increased fin height of the thinner gate oxide material FinFETs may increase the effective gate width, leading to a performance boost without an accompanying area penalty.

In some embodiments FinFETs having three different gate oxides and three different fin heights may be used for CMOS circuitry (e.g., sense amplifier circuitry, buffer circuitry, decoder circuitry, word decoder circuitry, periphery circuitry, without limitation) in memory devices (e.g., DRAM devices, without limitation) may be used. By tuning a fin reveal process, fin height may be adjusted during removal of oxide from the fins by also removing oxide surrounding the fins. Accordingly, fin height may be increased in thin gate oxide and intermediate thickness gate oxide devices as compared to fin height of thicker gate oxide devices.

FIG. 1 is a perspective view of a portion of an apparatus 100, according to some embodiments. The apparatus 100 includes first FinFETs 102, second FinFETs 104, and third FinFETs 106. The first FinFETs 102 include a first gate oxide 108 including a first gate oxide material 114, a second gate oxide material 116, and a third gate oxide material 118. The first FinFETs 102 also include first fins 130 including an active material. The first FinFETs 102 further include a work function metal 124, which serves as a gate terminal to the first FinFETs 102. Drain and/or source terminals of the first FinFETs 102 may be at portions of the first fins 130 that are not overlapped by the work function metal 124 (e.g., at spacers 138). In some embodiments the first gate oxide material 114 is an in-situ steam generated (ISSG) oxide material (e.g., an ISSG silicon dioxide). In some embodiments the second gate oxide material 116 is an atomic layer deposition (ALD) oxide material (e.g., an ALD silicon dioxide). In some embodiments the third gate oxide material 118 of the first FinFETs 102 includes a high-k dielectric material 122.

The second FinFETs 104 include a second gate oxide 110 including the second gate oxide material 116 and the third gate oxide material 118. In some embodiments the third gate oxide material 118 of the second FinFETs 104 includes the high-k dielectric material 122. The second FinFETs 104 are substantially free of the first gate oxide material 114. The second FinFETs 104 also include second fins 132 including the active material. The second FinFETs 104 further include the work function metal 124, which serves as a gate terminal to the second FinFETs 104. Drain and/or source terminals of the second FinFETs 104 may be at portions of the second fins 132 that are not overlapped by the work function metal 124 (e.g., at spacers 138).

The third FinFETs 106 include a third gate oxide 112 including the third gate oxide material 118. The third FinFETs 106 are substantially free of the first gate oxide material 114 and the second gate oxide material 116. The third gate oxide material 118 of the third FinFETs 106 includes an interfacial layer (IL) oxide material 120 and the high-k dielectric material 122 on the IL oxide material 120. The third FinFETs 106 also include third fins 134 including the active material. The third FinFETs 106 further include the work function metal 124, which serves as a gate terminal to the second FinFETs 104. Drain and/or source terminals (not shown) of the third FinFETs 106 may be at portions of the third fins 134 that are not overlapped by the work function metal 124 (e.g., at spacers 138).

The first gate oxide 108 of the first FinFETs 102 is thicker than the second gate oxide 110 of the second FinFETs 104 and the third gate oxide 112 of the third FinFETs 106. Also, the second gate oxide 110 is thicker than the third gate oxide 112, but is thinner than the first gate oxide 108 of the first FinFETs 102. Since the first gate oxide 108 of the first FinFETs 102 is thicker than the second gate oxide 110 of the second FinFETs 104 and the third gate oxide 112 of the third FinFETs 106, the first FinFETs 102 may be used for higher voltage potential operation than the second FinFETs 104 and the third FinFETs 106. Also, since the third gate oxide 112 is thinner than the first gate oxide 108 of the first FinFETs 102 and the second gate oxide 110 of the second FinFETs 104, the third FinFETs 106 may be used for lower voltage potential operation than the first FinFETs 102 and the second FinFETs 104. Furthermore, since the second gate oxide 110 of the second FinFETs 104 is thinner than the first gate oxide 108 of the first FinFETs 102 but thicker than the third gate oxide 112 of the third FinFETs 106, the second FinFETs 104 may be used for voltage potential operation that is between high voltage potential operation and low voltage potential operation.

The apparatus 100 also includes a semiconductor material 128 (e.g., silicon) over which the first FinFETs 102, the second FinFETs 104, and the third FinFETs 106 are formed. The first fins 130, the second fins 132, and the third fins 134 may be formed of this semiconductor material 128. The first fins 130, the second fins 132, and the third fins 134 may be separated at their lower portions by a shallow trench isolation (STI) oxide 136 (e.g., silicon dioxide). A conductive material 126, such as tungsten, may be formed on the first FinFETs 102, the second fins 132, and the third fins 134 (i.e., on the work function metal 124). In some embodiments the work function metal 124 between the conductive material 126 and the third gate oxide material 118 may include both n-type and p-type work function metals. By way of non-limiting example, the n-type work function metal may include titanium nitride (TiN). Also by way of non-limiting example, the p-type work function metal may include titanium aluminide (TiAl).

In some embodiments an apparatus includes first FinFETs, second FinFETs, and third FinFETs. The first FinFETs include a first gate oxide material, a second gate oxide material, and a third gate oxide material. The second FinFETs include the second gate oxide material and the third gate oxide material. The second FinFETs are substantially free of the first gate oxide material. The third FinFETs include the third gate oxide material. The third FinFETs are substantially free of the first gate oxide material and the second gate oxide material.

Figure 2:
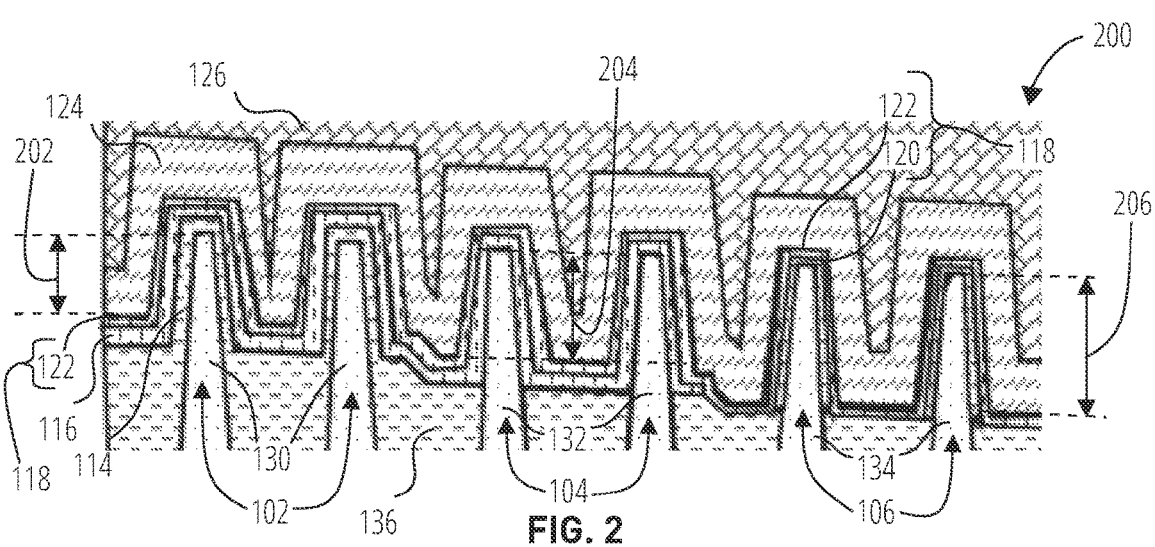
FIG. 2 is a segment of the perspective view of FIG. 1.

FIG. 2 is a segment 200 of the perspective view of FIG. 1. As illustrated in FIG. 2, a first fin height 202 of the first FinFETs 102 is less than a second fin height 204 of the second FinFETs 104 and a third fin height 206 of the third FinFETs 106. Also, the second fin height 204 of the second FinFETs 104 is less than the third fin height 206 of the third FinFETs 106. The first fin height 202 may be a height of a portion of the first fins 130 that is overlapped by the work function metal 124. Similarly, the second fin height 204 may be a height of a portion of the second fins 132 that is overlapped by the work function metal 124. Also, the third fin height 206 may be a height of a portion of the third fins 134 that is overlapped by the work function metal 124.

Since the third fin height 206 of the third FinFETs 106 is greater than the first fin height 202 of the first FinFETs 102 and the second fin height 204 of the second FinFETs 104, the third FinFETs 106 may have better performance than the first FinFETs 102 and the second FinFETs 104. Also, since the second fin height 204 of the second FinFETs 104 is greater than the first fin height 202 of the first FinFETs 102, the second FinFETs 104 may have better performance than the first FinFETs 102. Furthermore, since the first fin height 202 of the first FinFETs 102 is less than the second fin height 204 of the second FinFETs 104 and the third fin height 206 of the third FinFETs 106, the performance of the first FinFETs 102 may be inferior to that of the second FinFETs 104 and the third FinFETs 106.

Figure 3A:
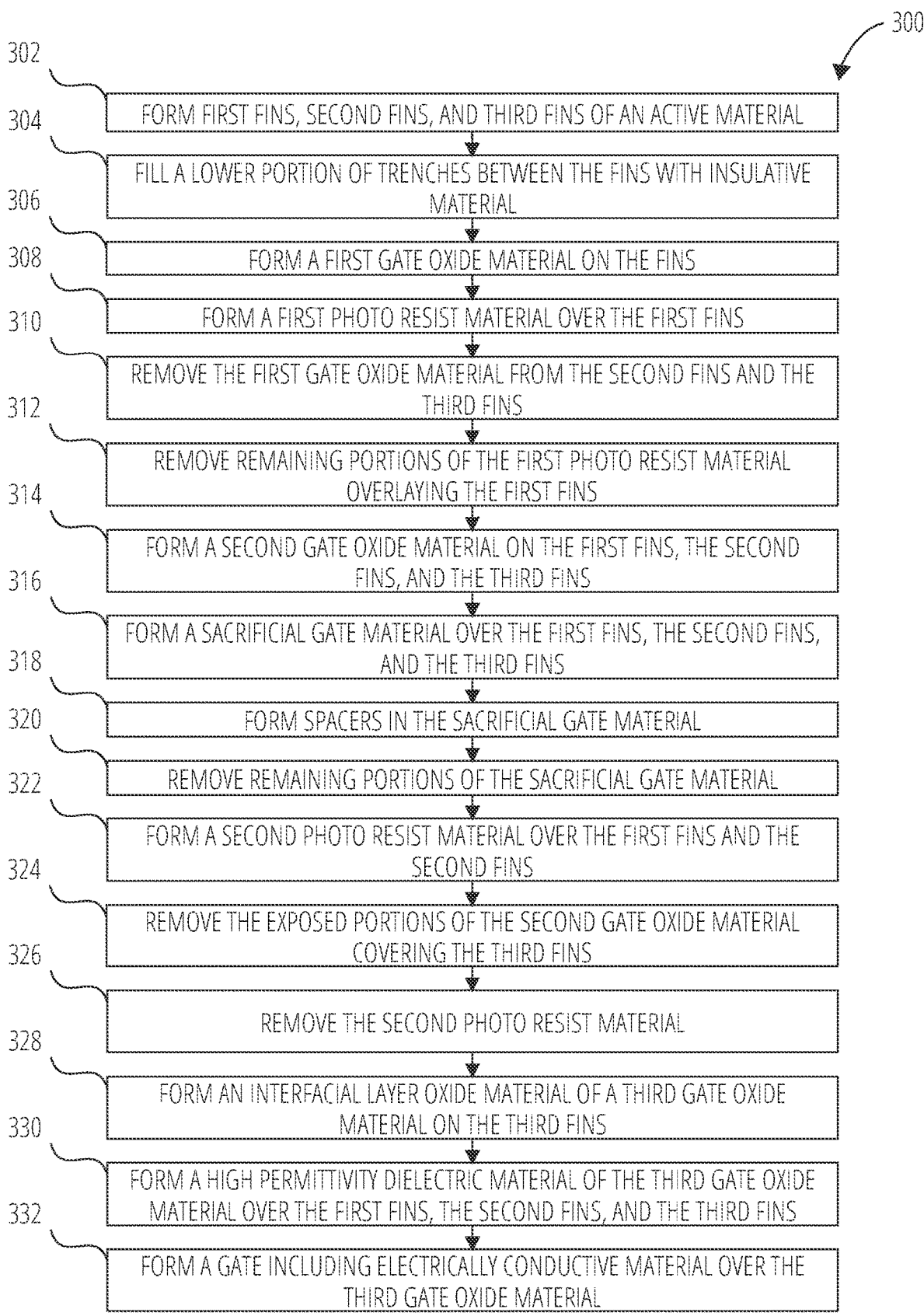
FIG. 3A is a flowchart illustrating a method of manufacturing a semiconductor device (e.g., such as the apparatus of FIG. 1), according to some embodiments.

FIG. 3A is a flowchart illustrating a method 300 of manufacturing a semiconductor device (e.g., such as the apparatus 100 of FIG. 1), according to some embodiments.

Figure 3B:
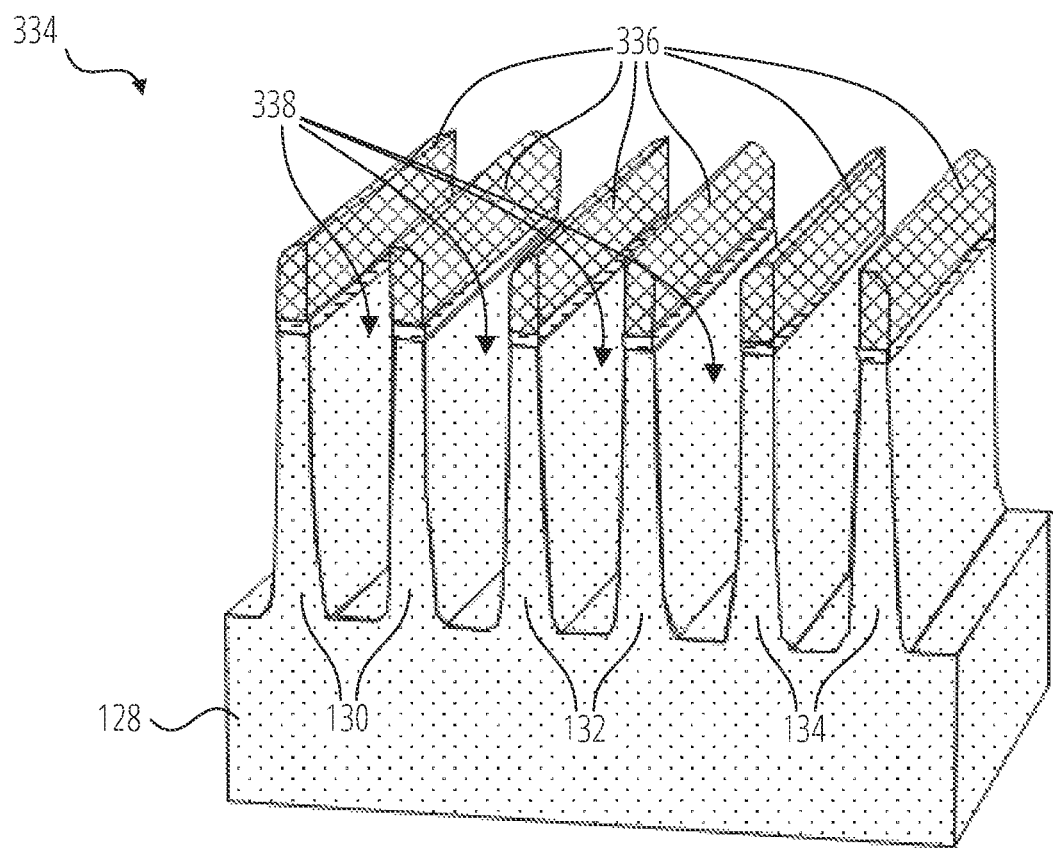
FIG. 3B through FIG. 3Q are perspective views of a workpiece illustrating the method of FIG. 3A.
Figure 3C:
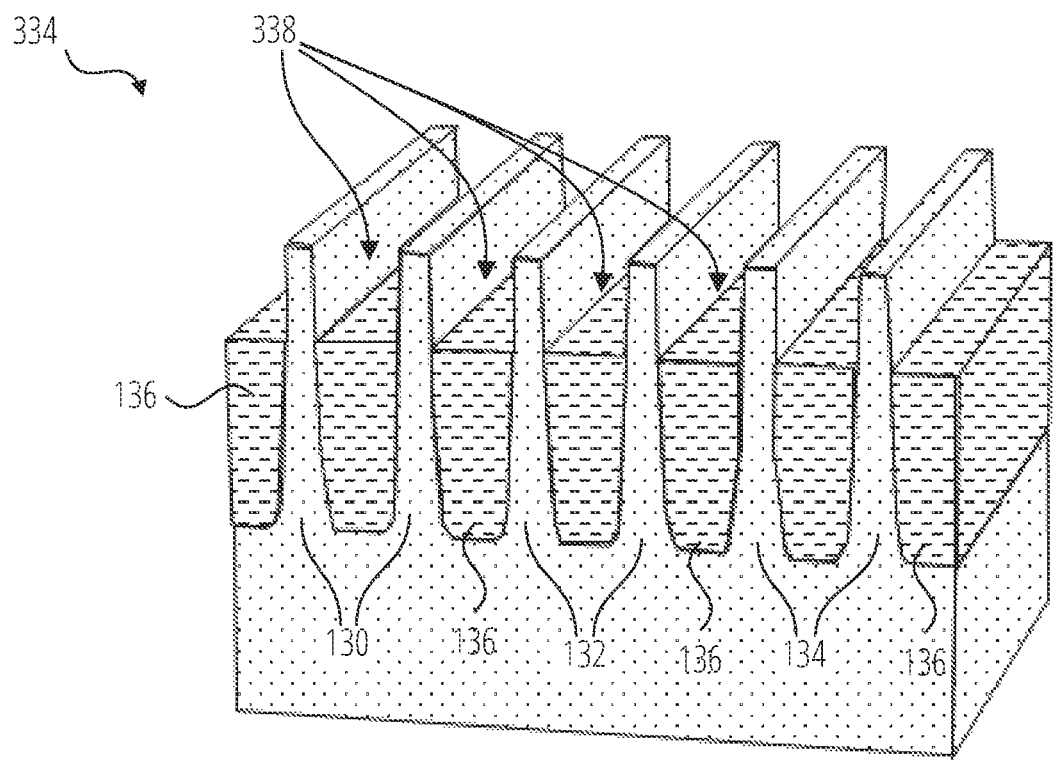
Figure 3D:
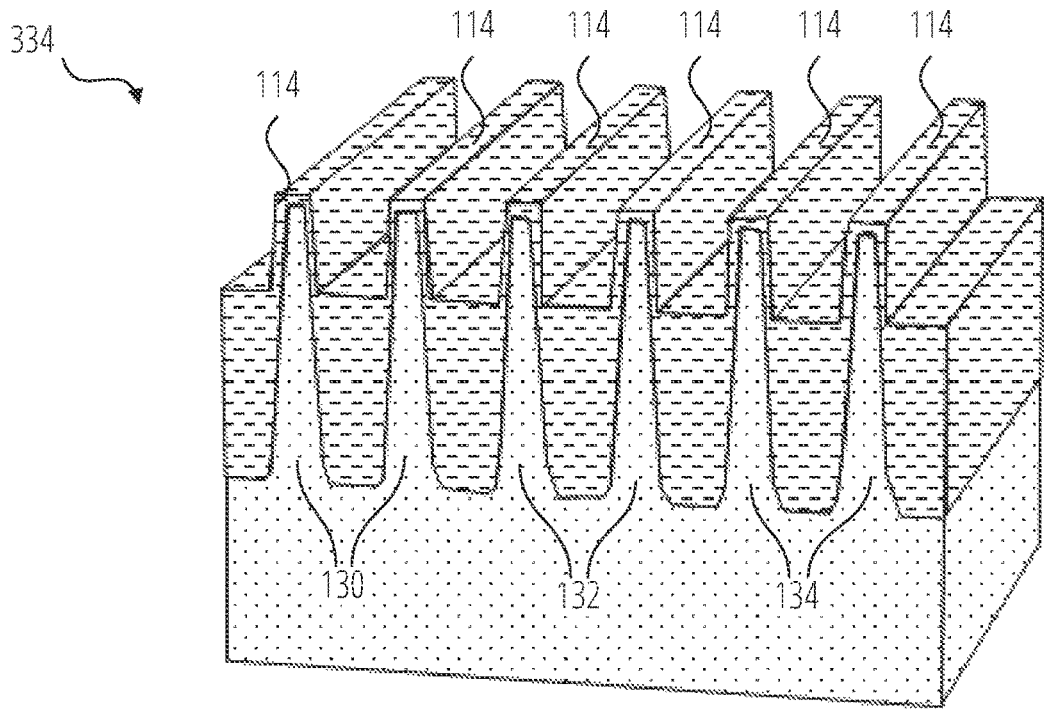
Figure 3E:
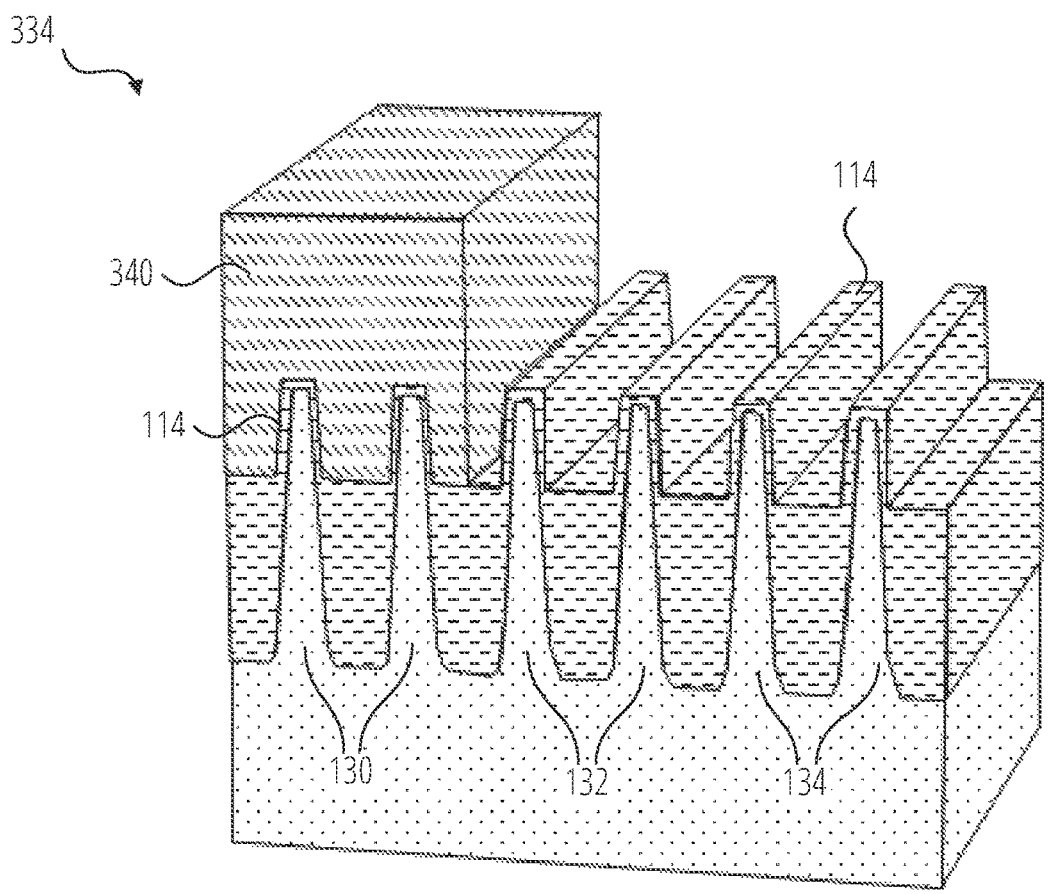
Figure 3F:
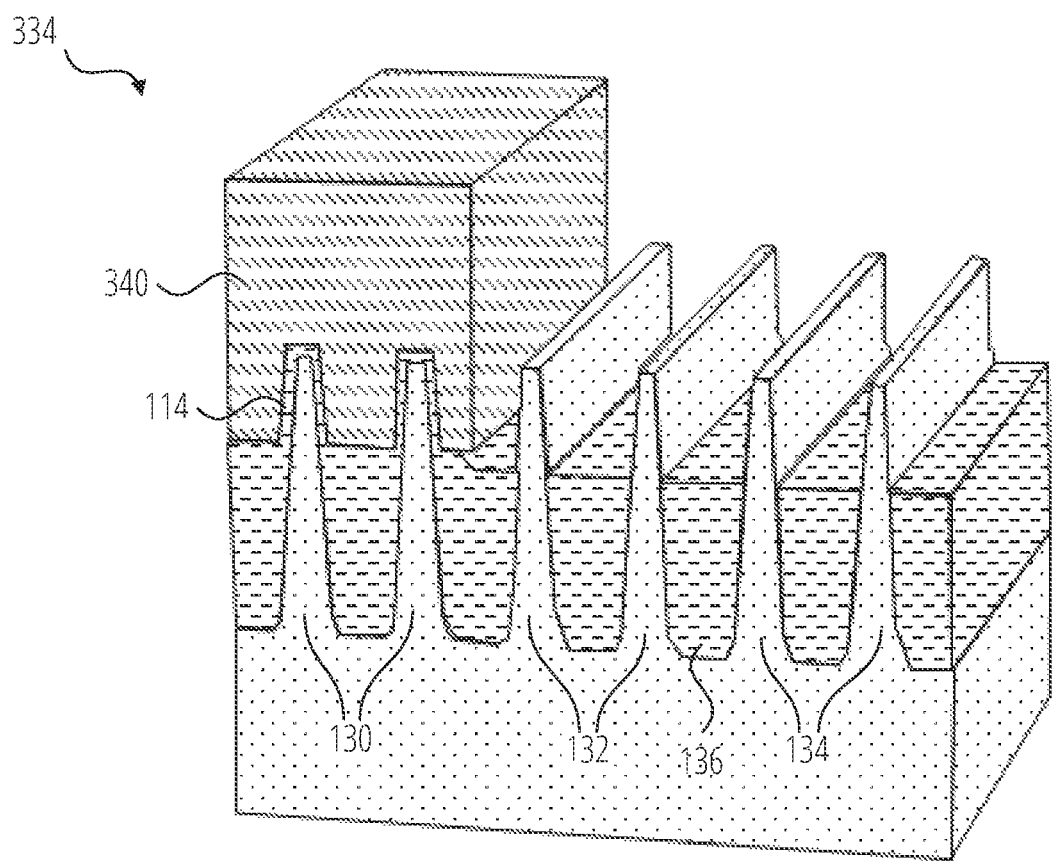
Figure 3G:
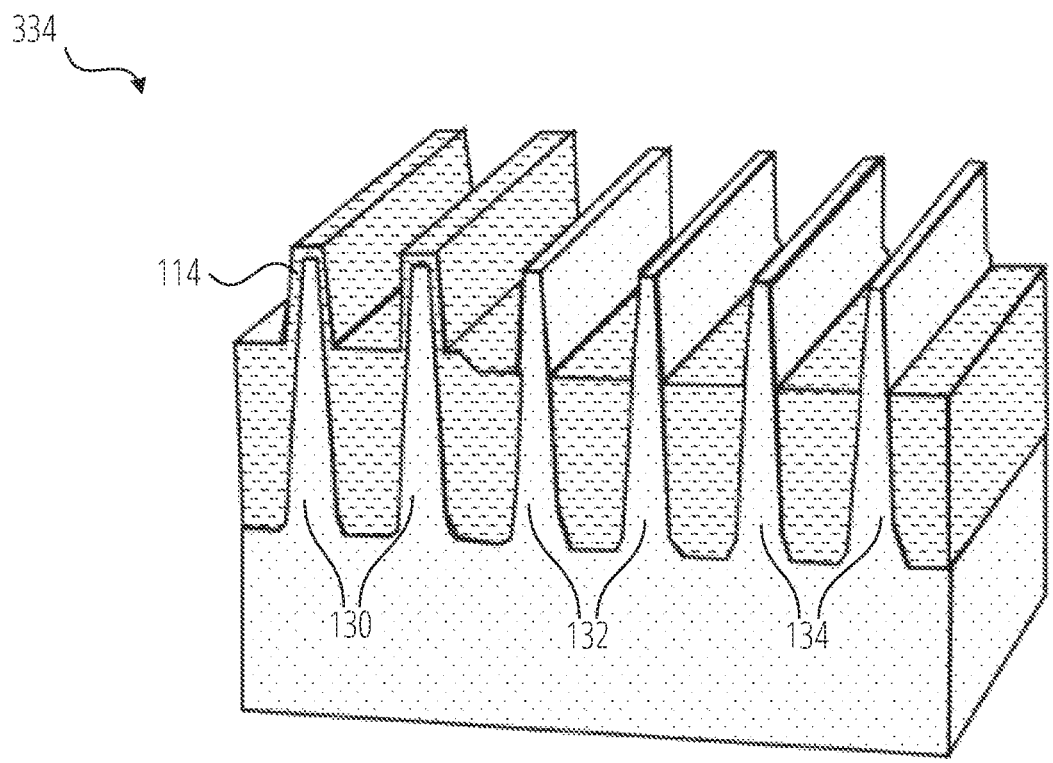
Figure 3H:
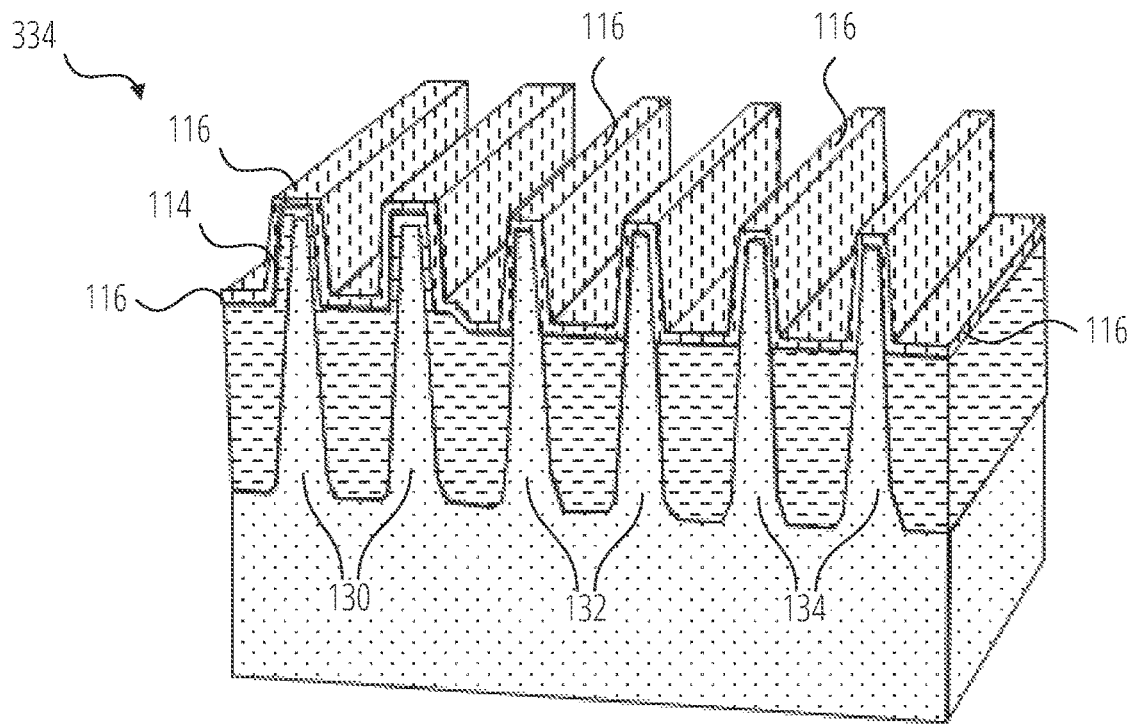
Figure 3I:
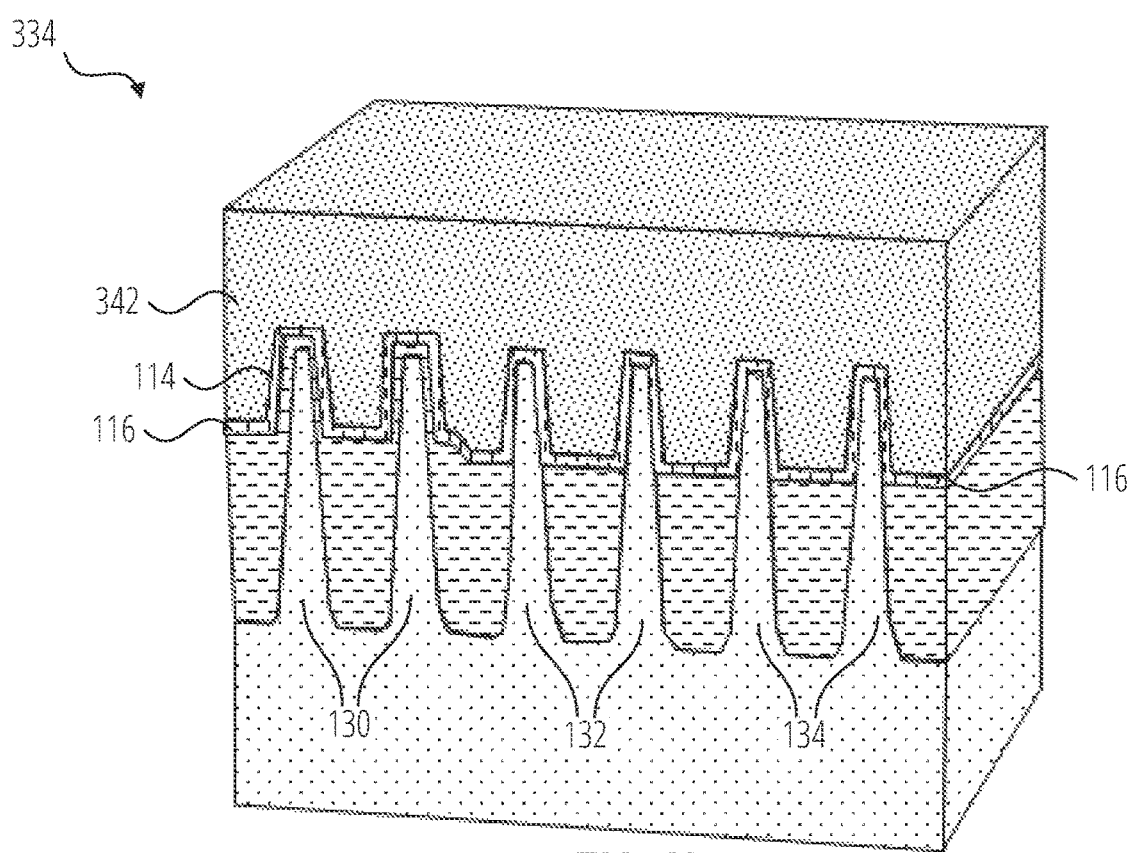
Figure 3J:
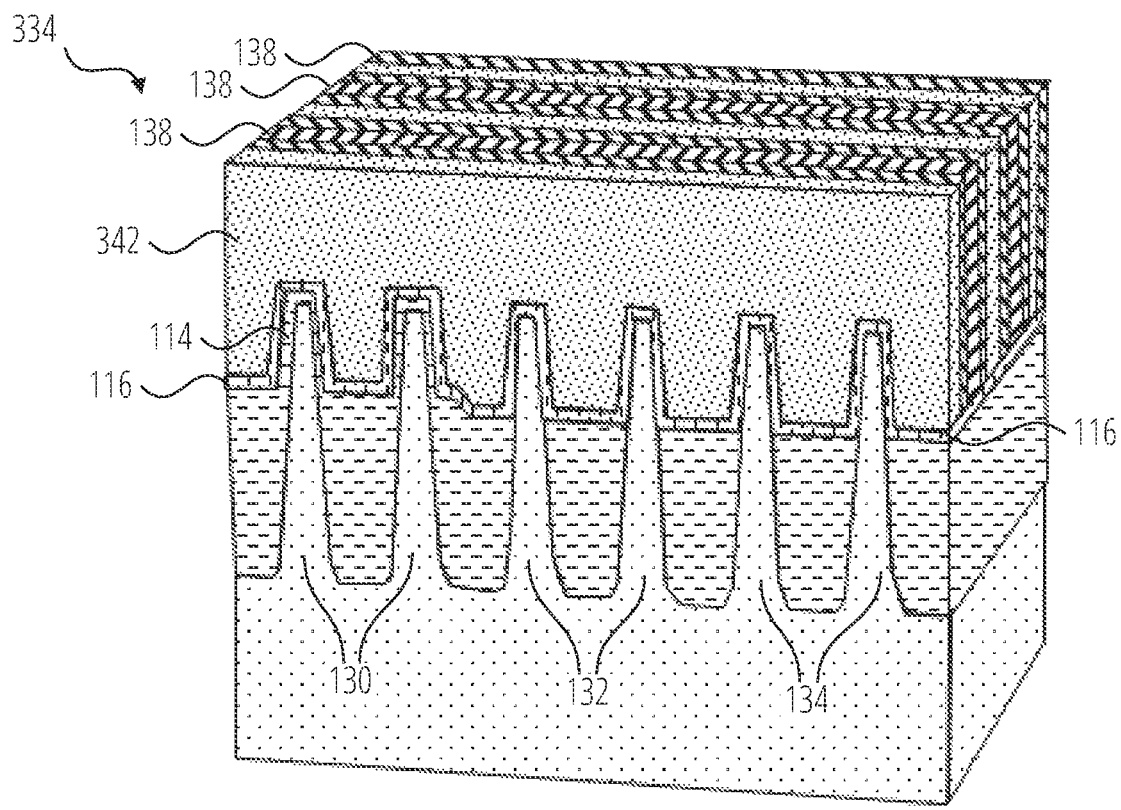
Figure 3K:
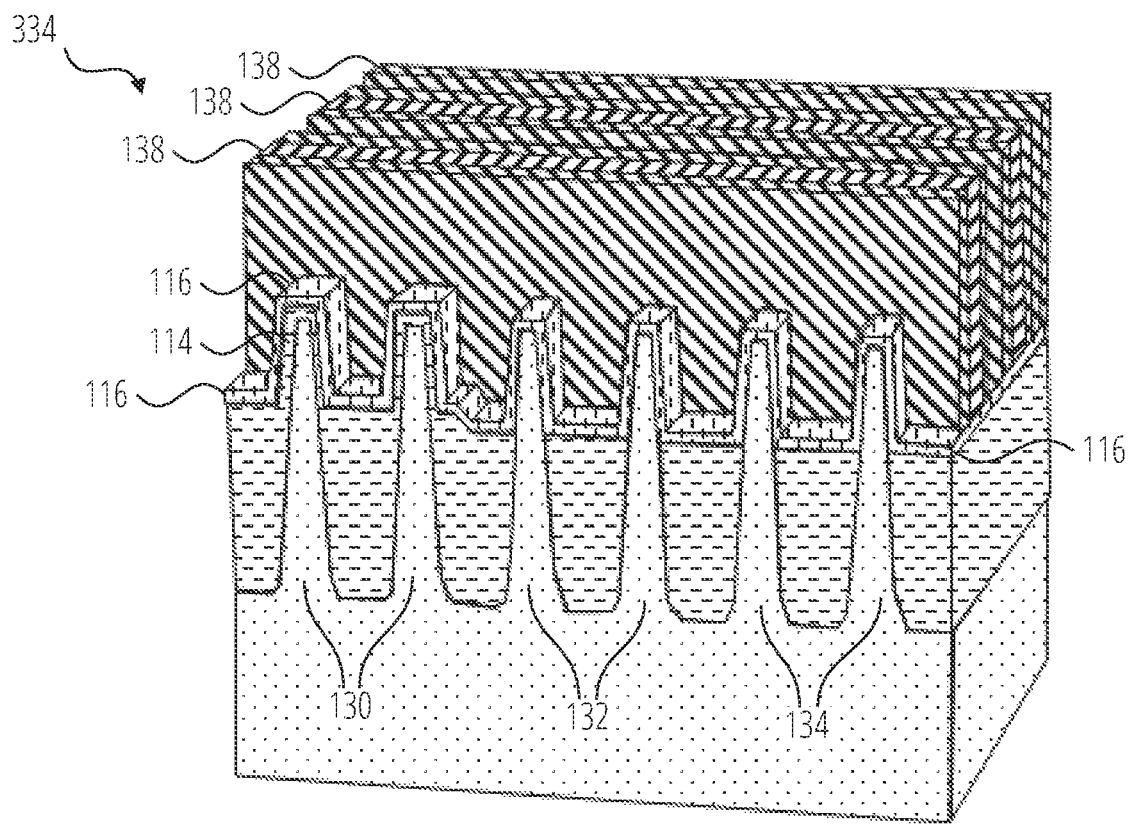
Figure 3L:
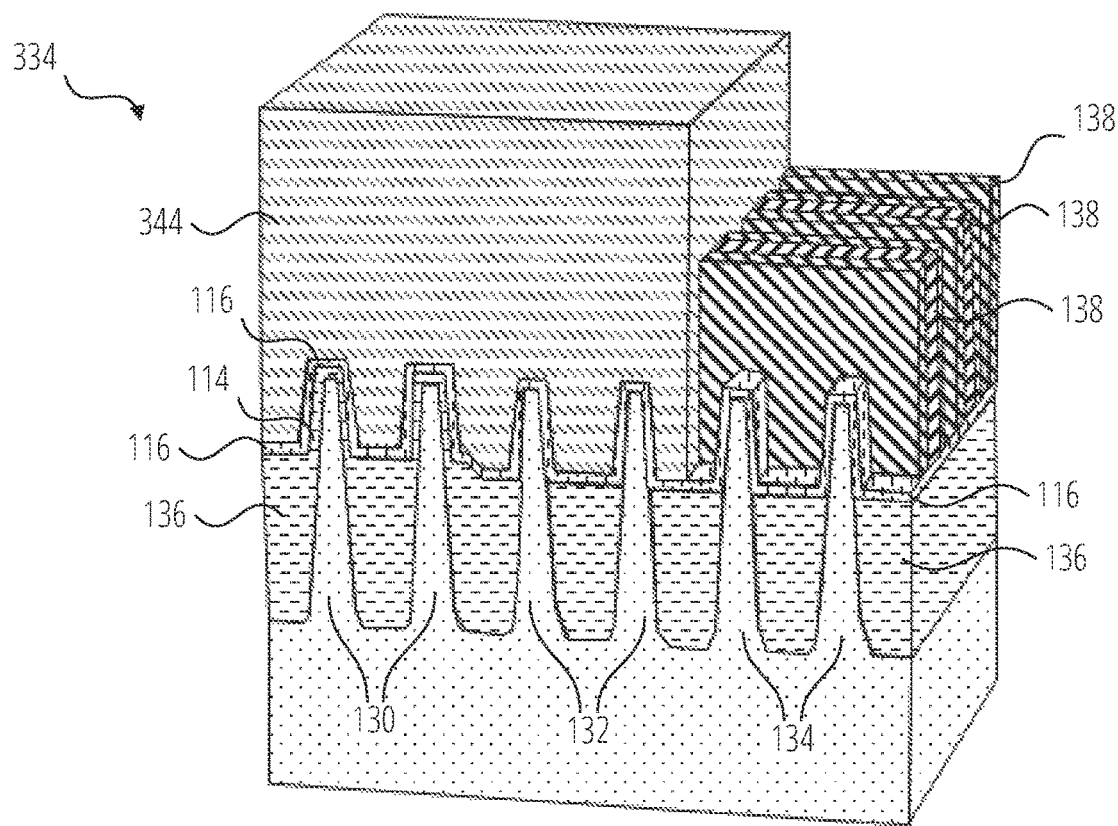
Figure 3M:
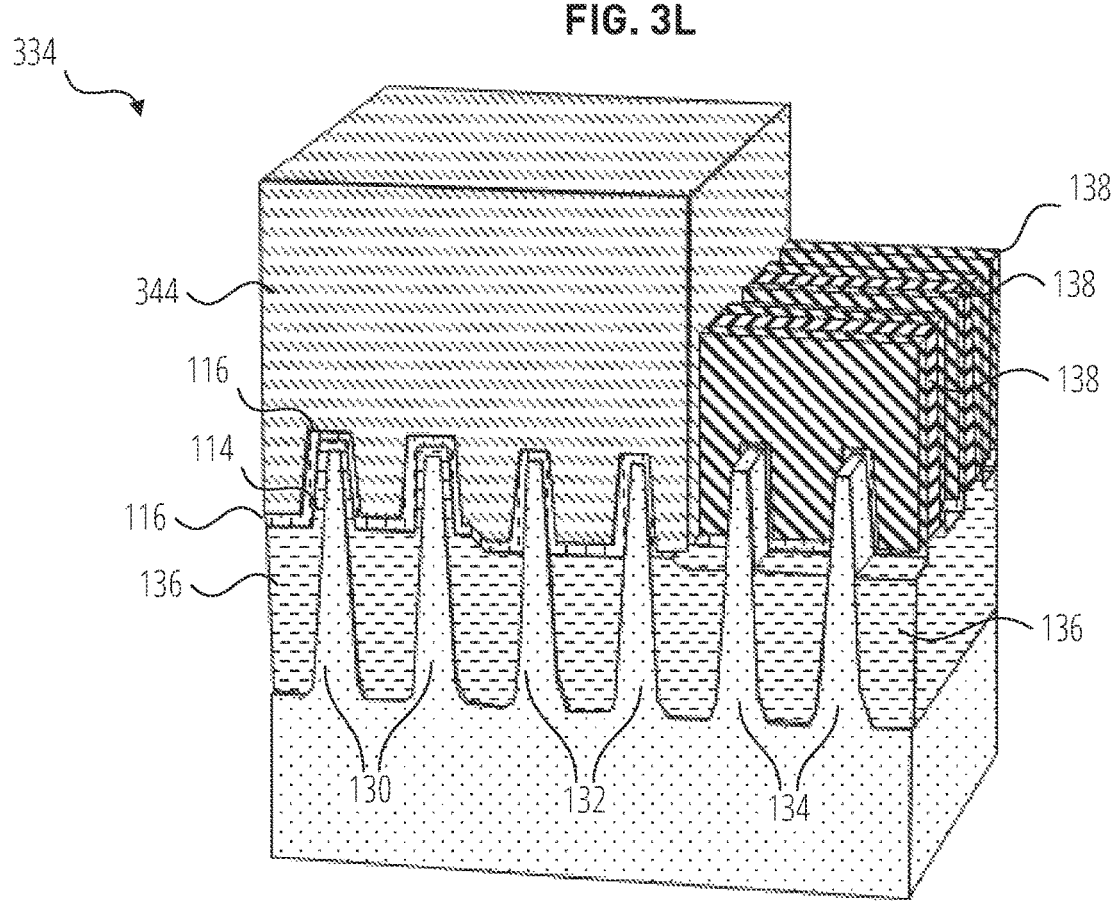
Figure 3N:
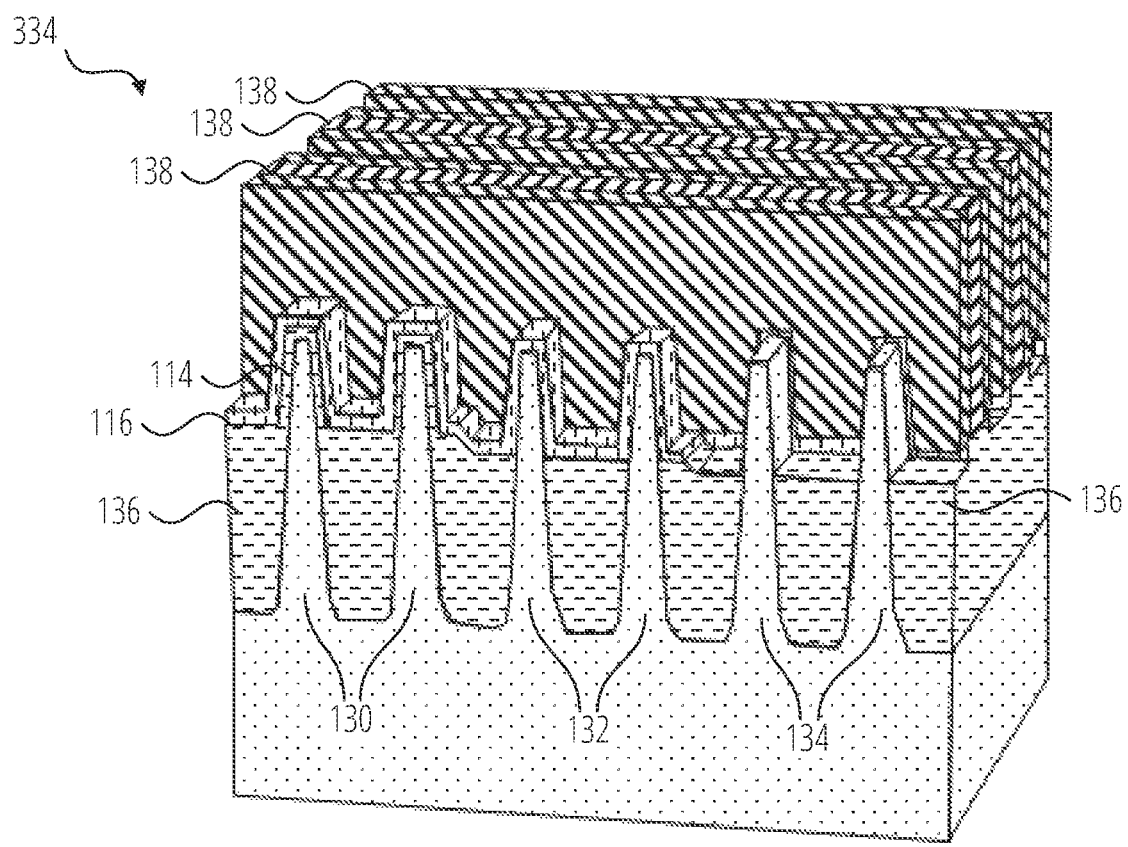
Figure 3O:
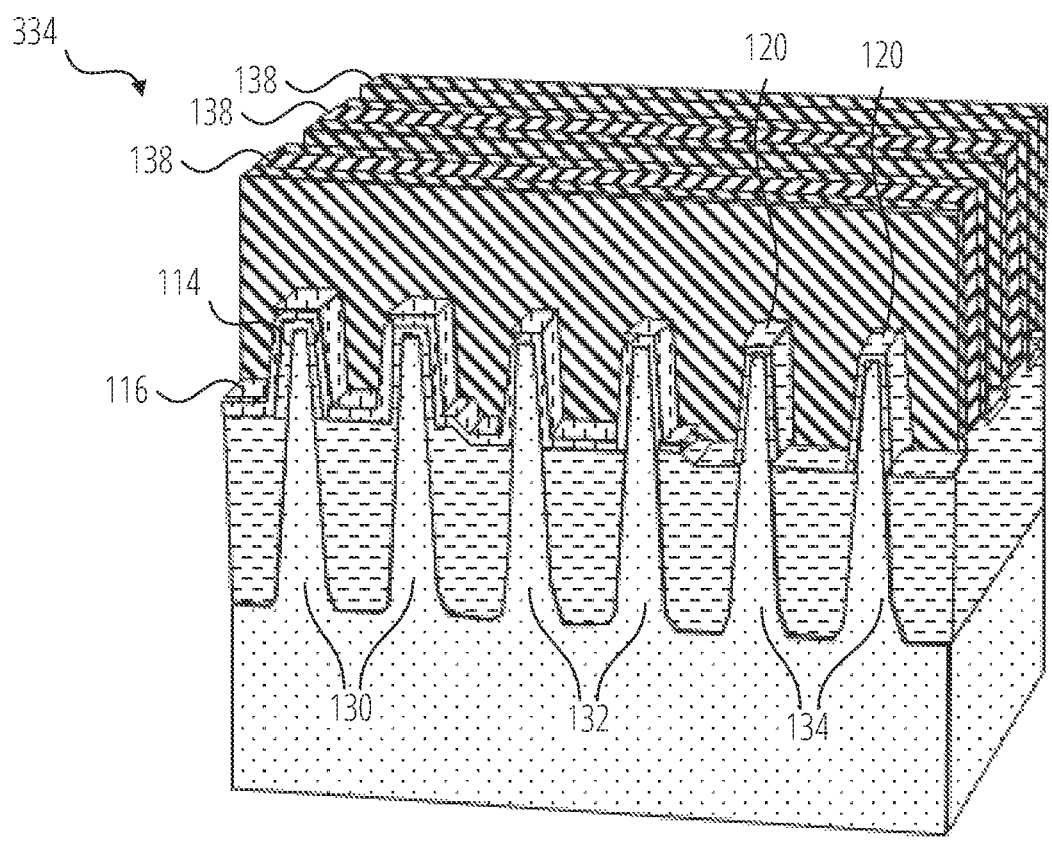
Figure 3P:
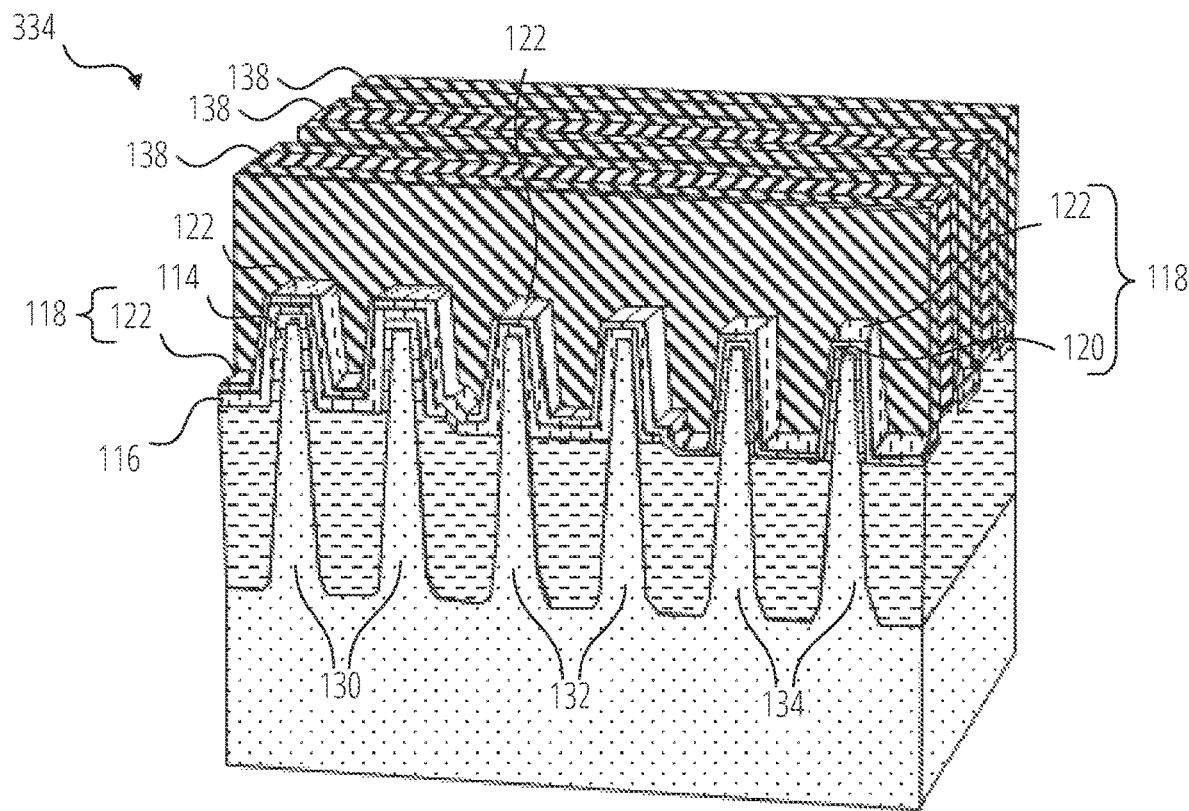
Figure 3Q:
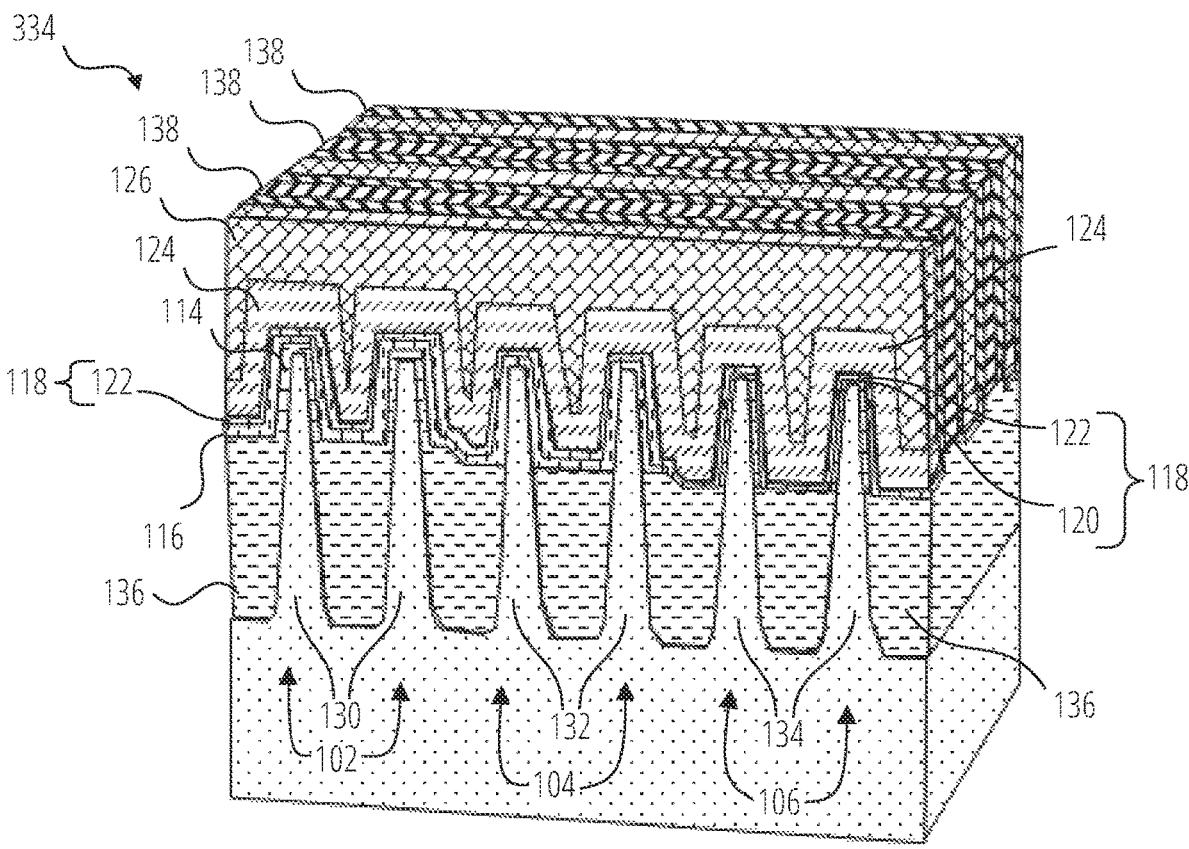

FIG. 3B through FIG. 3Q are perspective views of a workpiece 334 illustrating the method 300 of FIG. 3A. Referring to FIGS. 3A and 3B together, at operation 302 the method 300 includes forming first fins 130, second fins 132, and third fins 134 of an active material. The FIG. 3B illustrates a semiconductor material 128 and first fins 130, second fins 132, and third fins 134 individually formed to extend from the semiconductor material 128. By way of non-limiting example, photo resist 336 may be applied to portions of the semiconductor material 128 that will be formed into the fins, and then trenches 338 may be etched into the semiconductor material 128 to form the first fins 130, the second fins 132, and the third fins 134.

Referring to FIGS. 3A and 3C together, at operation 304 the method 300 includes filling a lower portion of the trenches 338 between the fins (e.g., the first fins 130, the second fins 132, and the third fins 134) with insulative material (e.g., dielectric oxide material). The photo resist 336 (FIG. 3B) may also be removed from the first fins 130, the second fins 132, and the third fins 134 (e.g., fin reveal). FIG. 3C illustrates an STI material 136 formed in the lower portions of the trenches 338 and the photo resist 336 (FIG. 3B) removed from the first fins 130, the second fins 132, and the third fins 134. In some embodiments filling the lower portion of the trenches 338 includes spinning on the STI material 136. The STI material 136 may comprise insulative material, such as dielectric oxide material (e.g., as silicon dioxide, without limitation).

Referring to FIGS. 3A and 3D together, at operation 306 the method 300 includes forming a first gate oxide material 114 (e.g., silicon dioxide) on the fins (e.g., the first fins 130, the second fins 132, and the third fins 134). FIG. 3D illustrates the first fins 130, the second fins 132, and the third fins 134 with the first gate oxide material 114 formed thereon. In some embodiments forming the first gate oxide material 114 on the first fins 130, the second fins 132, and the third fins 134 includes forming an ISSG oxide material on the first fins 130, the second fins 132, and the third fins 134 (e.g., using an ISSG process). As a result, some of the active material of the first fins 130, the second fins 132, and the third fins 134 may be consumed to form the first gate oxide material 114.

Referring to FIGS. 3A and 3E together, at operation 308 the method 300 includes forming a first photo resist material 340 over the first fins 130. The first photo resist material 340 may be formed on portions of the first gate oxide material 114 overlying the first fins 130. FIG. 3E illustrates the first photo resist material 340 formed to cover the first fins 130, but not formed to cover the second fins 132 or the third fins 134. The first photo resist material 340 is positioned over the first fins 130 to prevent removal of the first gate oxide material 114 overlying the first fins 130. The first photo resist material 340 does not cover the second fins 132 and the third fins 134. Accordingly, the first photo resist material 340 does not prevent removal of portions of the first gate oxide material 114 formed on the second fins 132 and the third fins 134 at operation 310.

Referring to FIGS. 3A and 3F together, at operation 310 the method 300 includes removing the first gate oxide material 114 from the second fins 132 and the third fins 134. In some embodiments removing the first gate oxide material 114 from the second fins 132 and the third fins 134 includes removing the first gate oxide material 114 using a vapor etch process. FIG. 3F illustrates the second fins 132 and the third fins 134 having the first gate oxide material 114 removed therefrom. Because of the first photo resist material 340 on the first fins 130, however, the first gate oxide material 114 remains on the first fins 130.

In some embodiments removing the first gate oxide material 114 from the second fins 132 and the third fins 134 includes increasing, relative to a first fin height of the first fins 130, a second fin height of the second fins 132 and a third fin height of the third fins 134 by removing a top portion of the STI material 136 between the second fins 132 and the third fins 134. FIG. 3F illustrates that the top portion of the STI material 136 has been removed in the vicinity of the second fins 132 and the third fins 134, but not in the vicinity of the first fins 130. The top portion of the STI material 136 in the vicinity of the second fins 132 and the third fins 134 is removed because the first photo resist material 340 does not shield the STI material 136 from being etched. By contrast, the STI material 136 in the vicinity of the first fins 130 is not removed because the first photo resist material 340 shields the STI material 136 in the vicinity of the first fins 130 from being etched.

Referring to FIGS. 3A and 3G together, at operation 312 the method 300 includes removing remaining portions of the first photo resist material 340 (FIG. 3F) overlying the first fins 130. FIG. 3G illustrates the workpiece 334 with the first photo resist material 340 (FIG. 3F) removed from remaining portions of the first gate oxide material 114 covering the first fins 130. The first gate oxide material 114 remains on the first fins 130, but not on the second fins 132 or the third fins 134.

Referring to FIGS. 3A and 3H together, at operation 314 the method 300 includes forming a second gate oxide material 116 on the first fins 130, the second fins 132, and the third fins 134. FIG. 3H illustrates the first fins 130, the second fins 132, and the third fins 134 with the second gate oxide material 116 formed thereover. Forming the second gate oxide material 116 over the first fins 130 may include forming the second gate oxide material 116 on the first gate oxide material 114 on the first fins 130. Forming the second gate oxide material 116 over the second fins 132 and the third fins 134 may include forming the second gate oxide material 116 on the second fins 132 and the third fins 134.

In some embodiments forming the second gate oxide material 116 over the first fins 130, the second fins 132, and the third fins 134 includes forming dielectric oxide material over the first fins 130, the second fins 132, and the third fins 134 by way of an ALD process. Dielectric oxide material formed through an ALD process is referred to herein as "ALD oxide material." Since an ALD oxide material is deposited without consuming active material of the fins (the first fins 130, the second fins 132, and the third fins 134), the second gate oxide material 116 may not reduce dimensions (e.g., vertical dimensions, horizontal dimensions) of the second fins 132 and the third fins 134. As a result, a relatively thick gate oxide (e.g., the first gate oxide 108 and the second gate oxide 110 of FIG. 1) may be achieved without undesirably removing portions of the active material of the second fins 132 and the third fins 134.

Referring to FIGS. 3A and 3I together, at operation 316 the method 300 includes forming a sacrificial gate material 342 over the first fins 130, the second fins 132, and the third fins 134. FIG. 3I illustrates the sacrificial gate material 342 formed on the second gate oxide material 116 overlying the first fins 130, the second fins 132, and the third fins 134. In some embodiments forming the sacrificial gate material 342 over the first fins 130, the second fins 132, and the third fins 134 includes forming polysilicon material over the first fins 130, the second fins 132, and the third fins 134. In some embodiments forming the sacrificial gate material 342 includes depositing polysilicon material and planarizing the polysilicon material (e.g., using a chemical mechanical planarization (CMP) process, without limitation).

Referring to FIGS. 3A and 3J together, at operation 318 the method 300 includes forming spacers 138 in the sacrificial gate material 342. FIG. 3J illustrates the sacrificial gate material 342 with the spacers 138 formed therein. In some embodiments forming the spacers 138 in the sacrificial gate material 342 includes forming trenches (e.g., substantially perpendicular to the trenches 338 of FIG. 3B and FIG. 3C through the sacrificial gate material 342, the second gate oxide material 116 and the first gate oxide material 114), forming spacers on lateral sides of the forming (e.g., epitaxially growing, without limitation) source and/or drain materials (e.g., epitaxial silicon phosphide (SiP) for NMOS transistors, epitaxial silicon germanium (SiGe) for PMOS transistors) on surfaces of the active material of the first fins 130, the second fins 132, and the third fins 134, forming interlayer dielectric (ILD) material in the trenches to substantially fill remaining, unfilled portions of trenches, and planarizing the workpiece 334 (e.g., using CMP) to remove portions of the ILD material and the source and/or drain materials outside of the boundaries (e.g., vertical boundaries, horizontal boundaries) of the trenches to form the spacers 138.

Referring to FIGS. 3A and 3K together, at operation 320 the method 300 includes removing remaining portions of the sacrificial gate material 342 (FIG. 3J). FIG. 3K illustrates the workpiece 334 with the sacrificial gate material 342 (FIG. 3J) removed from the second gate oxide material 116. Removing the remaining portions of the sacrificial gate material 342 may expose portions of the second gate oxide material 116 previously covered by the remaining portions of the sacrificial gate material 342 at the end of operation 318. The spacers 138 formed at operation 318 may remain as part of the workpiece 334 after the removal of the remaining portions of the sacrificial gate material 342 at operation 320.

Referring to FIGS. 3A and 3L together, at operation 322 the method 300 includes forming a second photo resist material 344 over the first fins 130 and the second fins 132. The second photo resist material 344 may shield portions of the second gate oxide material 116 overlying the first fins 130 and the second fins 132, as well as the STI material 136 in the vicinity of the first fins 130 and the second fins 132, from being removed at operation 324. The second photo resist material 344 may, however, leave additional portions of the second gate oxide material 116 overlying the third fins 134 exposed to facilitate subsequent removal of the additional portions of the second gate oxide material 116 on the third fins 134, as well as upper portions of the STI material 136 in the vicinity of the third fins 134.

Referring to FIGS. 3A and 3M together, at operation 324 the method 300 includes removing the exposed portions of the second gate oxide material 116 covering the third fins 134. By way of non-limiting example, the exposed portions of the second gate oxide material 116 may be removed using an etch process (e.g., a vapor etch process). FIG. 3M illustrates the workpiece 334 with the second gate oxide material 116 removed from the third fins 134. FIG. 3M also illustrates the first gate oxide material 114 and the second gate oxide material 116 remaining over the first fins 130, as well as the second gate oxide material 116 remaining over the second fins 132.

In some embodiments removing the exposed portions of the second gate oxide material 116 from the third fins 134 includes increasing, relative to a first fin height of the first fins 130 and a second fin height of the second fins 132, a third fin height of the third fins 134 by removing a portion of a the STI material 136 between the third fins 134. As was previously discussed with reference to FIG. 3F, top portions of the STI material 136 in the vicinity of the second fins 132 and the third fins 134 were already removed at operation 310. Accordingly, further removal of top portions of the STI material 136 in the vicinity of the third fins 134 at operation 324 may result in the third fin height of the third fins 134 being greater than the second fin height of the second fins 132, which in turn may be greater than the first fin height of the first fins 130, as illustrated in FIG. 3M.

Referring to FIGS. 3A and 3N together, at operation 326 the method 300 includes removing the second photo resist material 344 (FIG. 3M). FIG. 3N illustrates the workpiece 334 with the second photo resist material 344 (FIG. 3M) removed, so as to expose the portions of the second gate oxide material 116 and the spacers 138 previously covered thereby. As illustrated in FIG. 3N, the second gate oxide material 116 on the first fins 130 and the second fins 132 may be exposed, as well as the third fins 134 and the STI material 136 in the vicinity of the third fins 134.

Referring to FIGS. 3A and 3O together, at operation 328 the method 300 includes forming an IL oxide material 120 (e.g., silicon dioxide, without limitation) of a third gate oxide material 118 on the third fins 134. FIG. 3O illustrates the third fins 134 with the IL oxide material 120 formed thereon. In some embodiments forming the IL oxide material 120 includes forming the IL oxide material 120 using a wet process chemical oxide. Accordingly, the IL oxide material 120 may be grown on the active material of the third fins 134. Since the active material of the first fins 130 and the second fins 132 is covered by the second gate oxide material 116, the IL oxide material 120 may not be formed over the first fins 130 and the second fins 132. Also, if a wet process chemical oxide is used, the IL oxide material 120 may not grow on the spacers 138. If a deposition processes (e.g., ALD) is instead used, the IL oxide material 120 may be deposited over the first fins 130 and the second fins 132 in addition to on the third fins 134, and on the spacers 138 (unless deposition is blocked).

Referring to FIGS. 3A and 3P together, at operation 330 the method 300 includes forming a high-k dielectric material 122 (e.g., hafnium oxide, without limitation) of the third gate oxide material 118 over the first fins 130, the second fins 132, and the third fins 134. Accordingly, forming the third gate oxide material 118 over the first fins 130, the second fins 132, and the third fins 134 includes forming the IL oxide material 120 on at least the third fins 134 (operation 328), and then forming the high-k dielectric material 122 over the first fins 130, the second fins 132, and the third fins 134 (operation 330). As illustrated in FIG. 3P, the high-k dielectric material 122 may be formed on the IL oxide material 120, which was formed at operation 328. In the vicinity of the first fins 130 and the second fins 132 the third gate oxide material 118 may include only the high-k dielectric material 122. In the vicinity of the third fins 134 the third gate oxide material 118 may include both the IL oxide material 120 and the high-k dielectric material 122. It is noted that in some embodiments formation of the high-k dielectric material 122 on the spacers 138 may be blocked.

FIG. 3P illustrates the first gate oxide material 114, the second gate oxide material 116, and the third gate oxide material 118 over the first fins 130; the second gate oxide material 116 and the third gate oxide material 118 over the second fins 132; and the third gate oxide material 118 over the third fins 134. As a result, different gate oxide thicknesses may be achieved for the first fins 130, the second fins 132, and the third fins 134 according to embodiments disclosed herein.

Referring to FIGS. 3A and 3Q together, at operation 332 the method 300 includes forming one or more gate structures may formed of and including conductive material on the third gate oxide material 118. An individual gate structure may include the work function metal 124 (e.g., both n-type and p-type work function metals such as titanium nitride (TiN) and titanium aluminide (TiAl), respectively, without limitation) and conductive material 126 (e.g., a relatively low electrical resistance material such as tungsten, without limitation) on or over the work function metal 124. FIG. 3Q illustrates the work function metal 124 and the conductive material 126 over the third gate oxide material 118. A planarization process (e.g., CMP) may be used to planarize the conductive material 126.

In some embodiments a method of manufacturing a semiconductor device includes forming a first gate oxide material on first fins for first fin field effect transistors (FinFETs), second fins for second FinFETs, and third fins for third FinFETs. The first fins, the second fins, and the third fins each include an active material. The method also includes removing the first gate oxide material from the second fins and the third fins, and forming a second gate oxide material on remaining portions of the first gate oxide material on the first fins, and on the second fins and the third fins. The method further includes removing the second gate oxide material from the third fins, and forming a third gate oxide material on remaining portions of second gate oxide material overlying the first fins and the second fins, and on the third fins.

Figure 4:
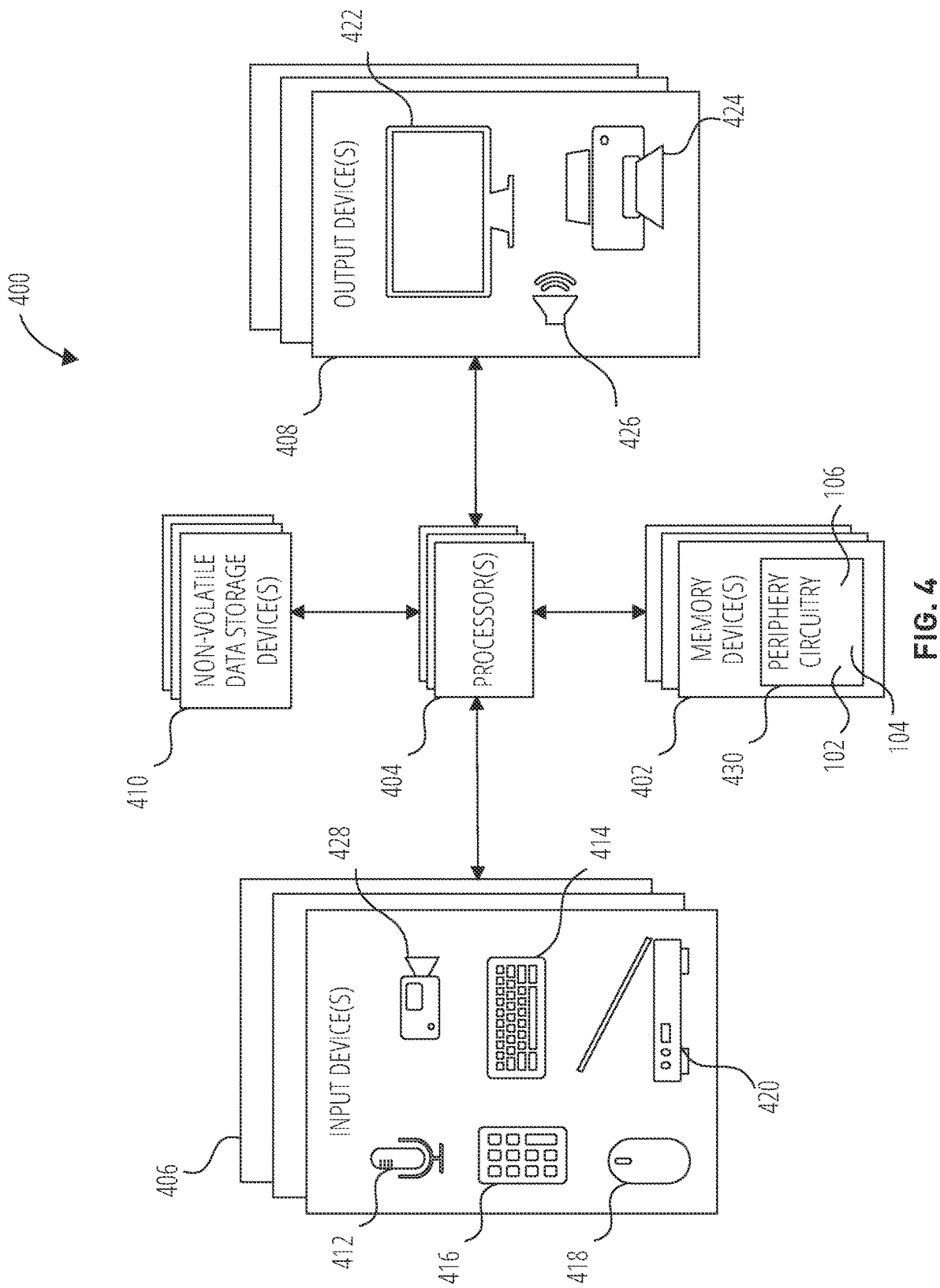
FIG. 4 is a block diagram of a computing system, according to some embodiments.

FIG. 4 is a block diagram of a computing system 400, according to some embodiments. The computing system 400 includes one or more processors 404 operably coupled to one or more memory devices 402, one or more non-volatile data storage devices 410, one or more input devices 406, and one or more output devices 408. In some embodiments the computing system 400 includes a personal computer (PC) such as a desktop computer, a laptop computer, a tablet computer, a mobile computer (e.g., a smartphone, a personal digital assistant (PDA), etc.), a network server, or other computer device.

In some embodiments the one or more processors 404 may include a central processing unit (CPU) or other processor configured to control the computing system 400. In some embodiments the one or more memory devices 402 include random access memory (RAM), such as volatile data storage (e.g., dynamic RAM (DRAM), static RAM (SRAM), without limitation). In some embodiments the one or more non-volatile data storage devices 410 include a hard drive, a solid state drive, Flash memory, erasable programmable read only memory (EPROM), other non-volatile data storage devices, or any combination thereof. In some embodiments the one or more input devices 406 include a keyboard 414, a pointing device 418 (e.g., a mouse, a track pad, without limitation), a microphone 412, a keypad 416, a scanner 420, a camera 428, other input devices, or any combination thereof. In some embodiments the output devices 408 include an electronic display 422, a speaker 426, a printer 424, other output devices, or any combination thereof.

The memory devices 402 may include periphery circuitry 430 including the first FinFETs 102, the second FinFETs 104, and the third FinFETs 106. The first FinFETs 102 include a first gate oxide (first gate oxide 108 of FIG. 1). The second FinFETs 104 include a second gate oxide (second gate oxide 110 of FIG. 1). The second gate oxide is thinner than the first gate oxide. The third FinFETs 106 include a third gate oxide (third gate oxide 112 of FIG. 1). The third gate oxide is thinner than the second gate oxide. By way of non-limiting example, complementary metal-oxide-semiconductor (CMOS) circuitry of the periphery circuitry 430 may be implemented using the second FinFETs 104, which may strike a balance between resilience to transistor breakdown and device performance.

In some embodiments a computing system includes FinFETs including a first gate oxide, second FinFETs including a second gate oxide, and third FinFETs including a third gate oxide. The second gate oxide is thinner than the first gate oxide. The third gate oxide is thinner than the second gate oxide.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D (e.g., A, B, and C; A, B, and D; A, C, and D; B, C, and D; A and B; A and C; A and D; B and C; B and D; or C and D).

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C" or "one or more of A, B, and C" is used, in general such a construction is intended to include A alone, B alone, C alone, A and B together, A and C together, B and C together, or A, B, and C together.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   first fin field effect transistors (FinFETs) including a first gate oxide material, a second gate oxide material, and a third gate oxide material;
   second FinFETs including the second gate oxide material and the third gate oxide material, the second FinFETs substantially free of the first gate oxide material; and
   third FinFETs including the third gate oxide material and substantially free of the first gate oxide material and the second gate oxide material, a first fin height of the first FinFETs less than a second fin height of the second FinFETs and a third fin height of the third FinFETs.

2. The apparatus of claim 1, wherein the first gate oxide material is an in-situ steam generated (ISSG) oxide material.

3. The apparatus of claim 1, wherein the second gate oxide material is an atomic layer deposition (ALD) oxide material.

4. The apparatus of claim 1, wherein the third gate oxide material includes a high permittivity (high-k) dielectric material.

5. The apparatus of claim 4, wherein the third gate oxide material of the third FinFETs also includes an interfacial layer (IL) oxide.

6. An apparatus, comprising:
   first fin field effect transistors (FinFETs) having a first fin height and including a first gate oxide material, a second gate oxide material, and a third gate oxide material;
   second FinFETs having a second fin height and including the second gate oxide material and the third gate oxide material but substantially free of the first gate oxide material, the first fin height of the first FinFETs less than the second fin height of the second FinFETs; and
   third FinFETs having a third fin height and including the third gate oxide material but substantially free of the first gate oxide material and the second gate oxide material, the second fin height of the second FinFETs less than the third fin height of the third FinFETs.

7. The apparatus of claim 1, wherein:
   the first FinFETs include a first gate oxide including the first gate oxide material, the second gate oxide material, and the third gate oxide material;
   the second FinFETs include a second gate oxide including the second gate oxide material and the third gate oxide material; and
   the third FinFETs include a third gate oxide including the third gate oxide material.

8. The apparatus of claim 7, wherein the first gate oxide is thicker than the second gate oxide and the third gate oxide.

9. The apparatus of claim 7, wherein the second gate oxide is thicker than the third gate oxide but thinner than the first gate oxide.

10. A computing system, comprising:
    first fin field effect transistors (FinFETs) having a first fin height and including a first gate oxide;
    second FinFETs having a second fin height and including a second gate oxide thinner than the first gate oxide; and
    third FinFETs having a third fin height and including a third gate oxide thinner than the second gate oxide, the first fin height of the first FinFETs less than the second fin height of the second FinFETs and the third fin height of the third FinFETs.

11. The computing system of claim 10, further comprising a memory device including periphery circuitry, the periphery circuitry including the first FinFETs, the second FinFETs, and the third FinFETs.

12. The computing system of claim 10, wherein:
    the first gate oxide includes an in-situ steam generated (ISSG) oxide material, an atomic layer deposition (ALD) oxide material, and a high-permittivity (high-k) dielectric material;
    the second gate oxide includes the ALD oxide material and the high-k dielectric material; and
    the third gate oxide includes an interfacial layer (IL) oxide material and the high-k dielectric material.

13. The computing system of claim 10, wherein the second fin height of the second FinFETs is less than the third fin height of the third FinFETs.

* * * * *

UNITED STATES PATENT AND TRADEMARK OFFICE
CERTIFICATE OF CORRECTION

| | | |
|---|---|---|
| PATENT NO. | : 12,199,094 B2 | Page 1 of 1 |
| APPLICATION NO. | : 17/453727 | |
| DATED | : January 14, 2025 | |
| INVENTOR(S) | : Yang et al. | |

It is certified that error appears in the above-identified patent and that said Letters Patent is hereby corrected as shown below:

In the Specification

Column 5,    Line 47,    change "some FinFET s than others." to --some FinFETs than others.--

Signed and Sealed this
Twenty-fifth Day of March, 2025

Coke Morgan Stewart
*Acting Director of the United States Patent and Trademark Office*